(12) United States Patent
Frame

(10) Patent No.: US 6,822,436 B2
(45) Date of Patent: Nov. 23, 2004

(54) UNIVERSAL TEST INTERFACE BETWEEN A DEVICE UNDER TEST AND A TEST HEAD

(75) Inventor: James Warren Frame, Chicago, IL (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/326,392

(22) Filed: Dec. 23, 2002

(65) Prior Publication Data

US 2003/0090259 A1 May 15, 2003

Related U.S. Application Data

(62) Division of application No. 09/808,009, filed on Mar. 15, 2001, now Pat. No. 6,552,528.

(51) Int. Cl.[7] .............................................. G01R 31/26
(52) U.S. Cl. ................................... 324/158.1; 323/765
(58) Field of Search .............................. 324/158.1, 755, 324/756, 765, 761, 762, 754; 439/482, 55–70

(56) References Cited

U.S. PATENT DOCUMENTS

| | | | |
|---|---|---|---|
| 4,231,629 A | 11/1980 | Kirby | |
| 4,574,332 A | 3/1986 | Calabro | |
| 4,616,178 A | 10/1986 | Thornton, Jr. et al. | |
| 4,931,726 A | 6/1990 | Kasukabe et al. | |
| 4,950,980 A | * 8/1990 | Pfaff | ........................ 324/755 |
| 4,964,808 A | 10/1990 | Riechelmann | |
| 5,014,002 A | 5/1991 | Wiscombe et al. | |
| 5,068,602 A | 11/1991 | Mielke | |
| 5,092,774 A | 3/1992 | Milan | |
| 5,124,636 A | 6/1992 | Pincus et al. | |
| 5,175,493 A | 12/1992 | Langgard | |
| 5,408,189 A | 4/1995 | Swart et al. | |
| 5,417,578 A | 5/1995 | Mroczkowski et al. | |
| 5,475,317 A | * 12/1995 | Smith | ........................ 324/760 |
| 5,506,510 A | 4/1996 | Blumenau | |
| 5,558,541 A | 9/1996 | Botka et al. | |
| 5,611,057 A | 3/1997 | Pecone et al. | |
| 5,801,541 A | 9/1998 | Rezvani | |
| 5,945,837 A | 8/1999 | Fredrickson | |
| 5,949,243 A | 9/1999 | Grasso | |
| 5,994,894 A | 11/1999 | Fujita | |
| 6,005,402 A | 12/1999 | Grasso | |
| 6,037,787 A | 3/2000 | Corwith | |
| 6,097,199 A | 8/2000 | Jeng et al. | |
| 6,198,297 B1 | * 3/2001 | Riccioni | ..................... 324/754 |
| 6,348,810 B1 | * 2/2002 | Yanagawa et al. | .......... 324/765 |
| 6,400,164 B1 | * 6/2002 | Sampath | ..................... 324/750 |
| 6,403,226 B1 | * 6/2002 | Biernath et al. | ............ 428/447 |

* cited by examiner

Primary Examiner—David Zarneke
Assistant Examiner—Tung X. Nguyen
(74) Attorney, Agent, or Firm—Staas & Halsey LLP

(57) ABSTRACT

In order to form a modular interface between a DUT board, which is housing devices under tests (DUT), to cables connected to a test head, a board spacer is provided that has an array of connectors. Each cable is connected to a respective connector, and the DUT board contains a corresponding array of connection points which are less than or equal to the number of connectors in the arrays on the board spacer. In this way, a common board spacer can be used to connect the cables to DUT boards housing different types of DUTs since the location of the connection points on the board spacer is known and kept constant. This interface allows a high speed and high fidelity connection between the test head and the devices on the DUTs for frequencies in excess of 50 MHz.

13 Claims, 12 Drawing Sheets

UNIVERSAL TEST INTERFACE BETWEEN A DEVICE UNDER TEST AND A TEST HEAD

CROSS-REFERENCE TO RELATED APPLICATIONS

This application is a divisional of U.S. patent application Ser. No. 09/808,009, filed Mar. 15, 2001 in the United States Patent and Trademark Office, now U.S. Pat. No. 6,552,528, the disclosure of which is incorporated herein by reference.

BACKGROUND OF THE INVENTION

1. Field of the Invention

This invention relates generally to automatic test equipment used to test integrated circuit elements, and more particularly to interface hardware used in automatic test equipment to connect devices under test to a test head in order to perform the testing.

2. Description of the Related Art

Automatic test equipment (i.e., a tester) is generally used to test semiconductor devices and integrated circuit elements, such as memory or logic for manufacturing defects. A general representation of a tester is shown in FIG. 1. As shown, a tester 1 has a tester body 10, which is in communication with a test head 20. The test head 20 is in communication with devices under test (DUTS) 60 via an interface 30. The DUTs 60 are the various integrated circuit elements being tested. In this way, multiple DUTs 60 can be tested rapidly and simultaneously. Further, after a group of DUTs 60 are tested, a new group of DUTs 60 are introduced for testing using a handler 5.

As shown in FIGS. 2 and 3, the DUTs 60 are arrayed on DUT boards 80. The DUT boards 80, also known as socket boards, device interface boards, and load boards, are on respective board spacers 40, which rest on a spacing frame 50. The board spacers 40 are hollowed in the center to allow cables 70 to be attached to the DUT boards 80. Each DUT 60 is connected to a respective cable 70 through solder-lined through holes 83 in the DUT board 80, with the actual connection being at solder point 82. As such, each cable 70 is solder connected, individually, to the DUT board 80.

For a conventional tester 1, when a new type of DUT 60 is to be tested, the new DUT 60 is brought to the tester 1 via handler 5 and connected to a test socket (not shown), completing the electrical connection between the test head 20 and the new DUT 60. The test is then performed. After completion of the test, the DUT 60 is then removed from the test socket via handler 5, and a new DUT 60 of the same type is installed into the test socket using the handler 5.

If a new type of DUT 60 is to be tested, the old DUT board 80 must be replaced and a new DUT board 80 inserted in its place. The new DUT board 80 will have different connection needs reflecting the new type of DUT 60. As such, either a new interface assembly must be used, or the cables 70 must be resoldered at different solder points 82. In either case, the cables 70 are custom fitted to different DUT boards 80 for each new type of DUT 60 to be tested. Further, where the cables 70 are resoldered, each change in DUT 60 type requires that the interface assembly, including the board spacer 40, be partially or wholly disassembled, the cables 70 be soldered onto respective solder points 82 of the new DUT board 80, and the interface be reassembled. On the other hand, where the entire interface assembly is replaced, large numbers of interface assemblies must be stored for each type of DUT 60 to be tested.

This use of solder connections is problematic since it is time consuming to attach the cables 70 to the solder points 82 of the DUT boards 80. This problem is exacerbated as both the density and/or number of DUTs 60 increases. For instance, modern testers can accommodate up to 128 DUTs 60 per test head 20, with changes in the types of DUTs 60 being made multiple times per week, or even per day. As such, the requirement that the interface be disassembled and reassembled, and the custom soldering to connect the cables 70 to the different types of DUT boards 80 can require significant time and expense to perform for each change in the type of DUT 60 to be tested, and also significantly increases the amount of time required to test the DUT 60s.

As shown in FIG. 4A, one solution to the limitations of solder connection has been to utilize spring loaded pogos 100, such as the pogo pin produced by Everett Charles, which rest on respective pogo boards 110. The pogos 100 include an internal spring that allows the top half of the pin 100 to be biased against a pad 90 on the DUT board 80, thus forming a communication pathway to a respective DUT 60. Using this system, when a new type of DUT 60 is to be tested, the cables 70 do not have to be soldered to the DUT board 80. Instead, the cables 70 remain soldered to the pogo boards 110, and the new DUT board 80 is placed on the pogo board 110 such that the pins 100 are biased against respective pads 90 to form the communication pathways. As such, the entire interface does not have to be changed.

However, this solution also is problematic as the number and density of DUTs 60 being tested increases. As the density of DUTs 60 being tested increases, smaller and smaller pogos 100 must be used in order to fit into the space provided under the DUT board 80. As the pogos 100 get smaller, they become more delicate and difficult to work with. Further, as pogos 100 get smaller, their stroke (i.e., the distance that the tip of the pin 100 can travel vertically in order to bias against pad 90) decreases, which means that the DUT board 80 and the pogo boards 110 must be made highly planar to ensure a connection at all pads 90. This increases the production cost for the pogo boards 110 and the DUT boards 80. In addition, pogos 100 are themselves expensive to use. As such, pogos 100 do not present an ideal alternative to solder connection as the density and/or number of DUTs 60 increases.

Where the DUT 60 is a logic element 65, it is known to perform lower parallelism testing using plugs 160 as shown in FIGS. 4B and 4C. For logic elements, the cables 70 are soldered into daughter boards within plugs 160. The plugs 160, such as the Micopax plug produced by FCI, are held by a plug holder 180, and are connected to respective receptacles 170. The receptacles 170 are connected to a logic board 150. In this way, instead of directly solder-connecting the cables 70 to the logic board 150, the plugs 160 are received by receptacles 170 located on the logic board 150. Not all of the plugs 160 are used for each type of logic element 65 tested.

However, this configuration is known for use in lower-parallelism testing of logic elements 65, and requires the use of eight or more plugs 160 per logic board 150. Such a configuration is unsuitable for high-density, high-parallelism testing of DUTs, especially where the DUT is a smaller device such as a memory device. In order to test these devices, the DUT boards are smaller, which prevents the use of numerous plugs 160. Further, the handlers 5 that move the memory devices, such as the Advantest M65XX and M67XX series handlers, use spacing frames having a pitch that does not allow the use of a large number of plugs 160 in order to test these devices. Thus, for high-parallelism testing of memory devices (i.e., simultaneous testing of 32 or more devices), conventional plug arrangements were not possible.

SUMMARY OF THE INVENTION

It is an object of the invention to provide a connection system between devices under test and a test head that provides a secure modular connection to the devices under test for high data rates without causing degradation in signal quality.

It is a further object of the invention to provide a high density, scalable connection system between devices under test and a test head.

Additional objects and advantages of the invention will be set forth in part in the description which follows and, in part, will be obvious from the description, or may be learned by practice of the invention.

Accordingly, to achieve these and other objects, an embodiment of the present invention uses an interface between a device under test (DUT) and cables, including a first board having an array of first connectors, each first connector connected to a respective cable, and a second board holding the DUT and having second connectors, each second connector being connected to the DUT and to a respective first connector, and where the number of second connectors is less than the number of first connectors.

According to another embodiment of the invention, the first connectors and second connectors comprise pairs of header connectors and shielded-controlled impedance connectors.

According to a further embodiment of the invention, the first connectors and the second connectors comprise pairs of pads allowing a board-to-board connection between the first board and the second board.

According to another embodiment of the present invention, an interface to perform high-parallelism testing of memory devices comprises a first board holding one of the memory devices and having a receptacle connected to the one memory device, and a plug connected to respective cables and to the receptacle to create a communication pathway, wherein combinations of the first boards and the plugs allow high-parallelism testing of the memory devices.

According to a still further embodiment of the present invention, a method of connecting a DUT on a DUT board to cables for testing comprises unplugging a first DUT board having a first number of connectors from respective cables held in an array on a board spacer, and plugging a second DUT board having a second number of connectors different from the first number of connectors into the cables.

According to yet another embodiment of the present invention, a method of connecting a DUT on a DUT board to cables for testing comprises removing a first DUT board having first pads connected to a first DUT from a board spacer having board pads connected to the cables, where respective pairs of first pads and board pads formed a board-to-board connection creating first communication pathways for signals between the cables and the first DUT, and placing a second DUT board having second pads connected to a second DUT onto the board spacer to form a board-to-board connection creating a second communication pathways for signals between the cables and the second DUT.

According to still another embodiment of the present invention, a method of connecting a memory device on a DUT board to cables for high-parallelism testing of memory devices that comprises unplugging a first DUT board having a first receptacle from a plug connected to respective cables, and plugging a second DUT board having a second receptacle into the plug to form a communication pathway between the memory device and the cables, wherein combinations of the second DUT boards and the plugs allow high-parallelism testing of the memory devices.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
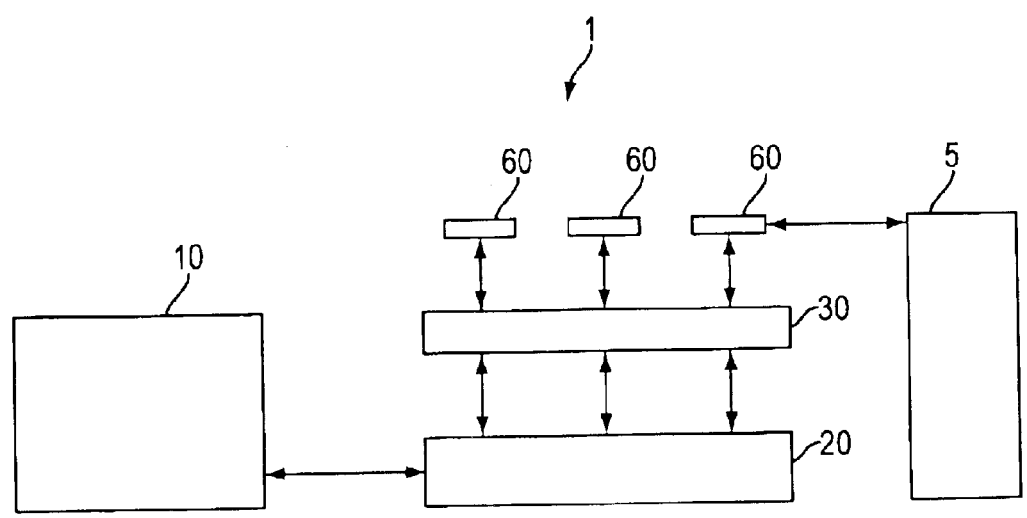
FIG. 1 is a schematic view showing a conventional tester including the communication between the test body, the test head, the handler, and the devices under test (DUTs)
Figure 2:
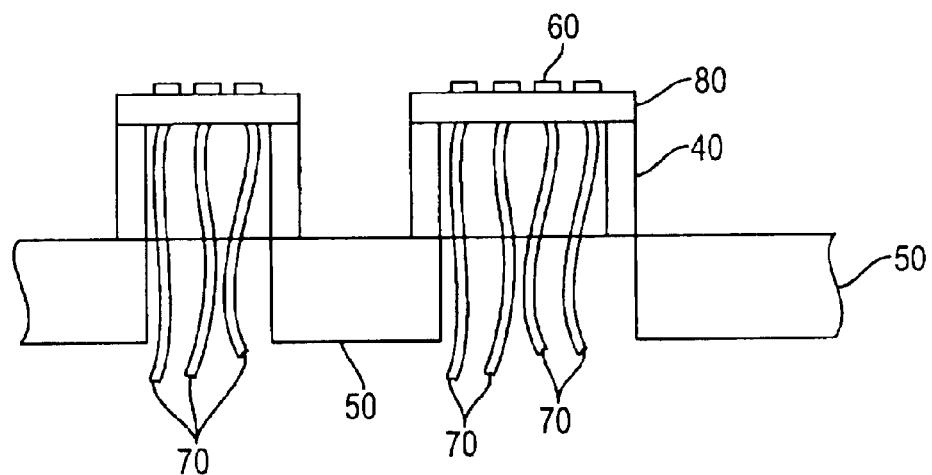
FIG. 2 is a side cross sectional view of a conventional solder connected interface between DUT boards and cables including the board spacer and spacing frame.
Figure 3:
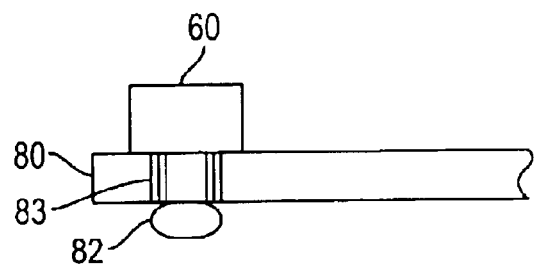
FIG. 3 is a side cross sectional view of a conventional solder connection between a cables and the DUT board for an individual DUT.
Figure 3:
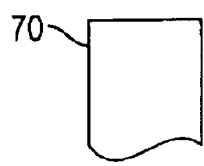
Figure 4A:
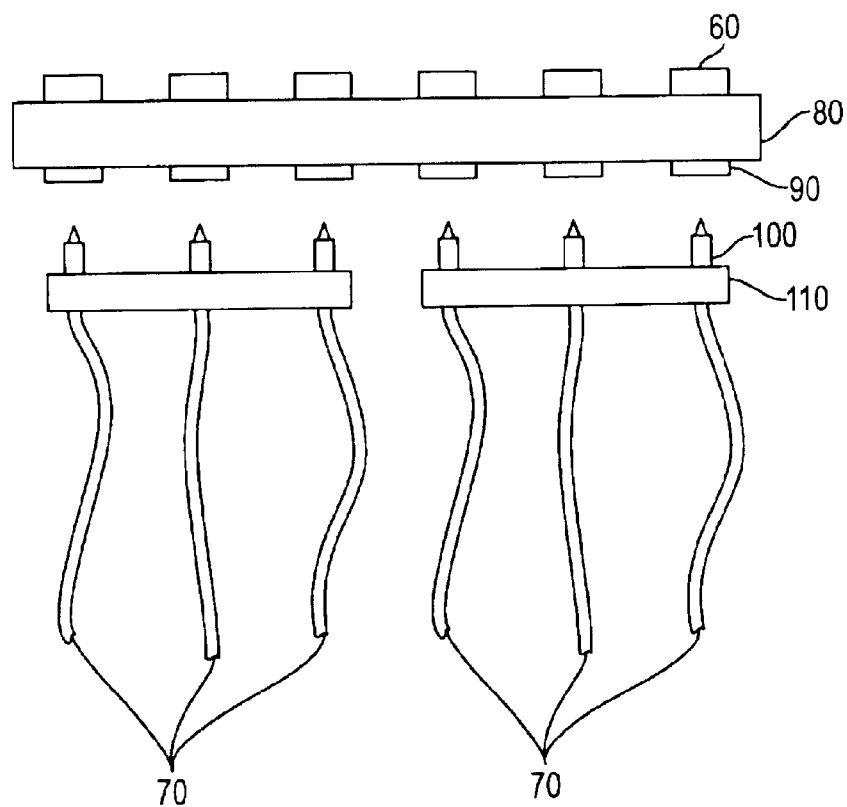
FIG. 4A is a side cross sectional view of a conventional pogo interface between the DUT board and the cables using spring loaded pogos mounted on daughter boards.
Figure 4B:
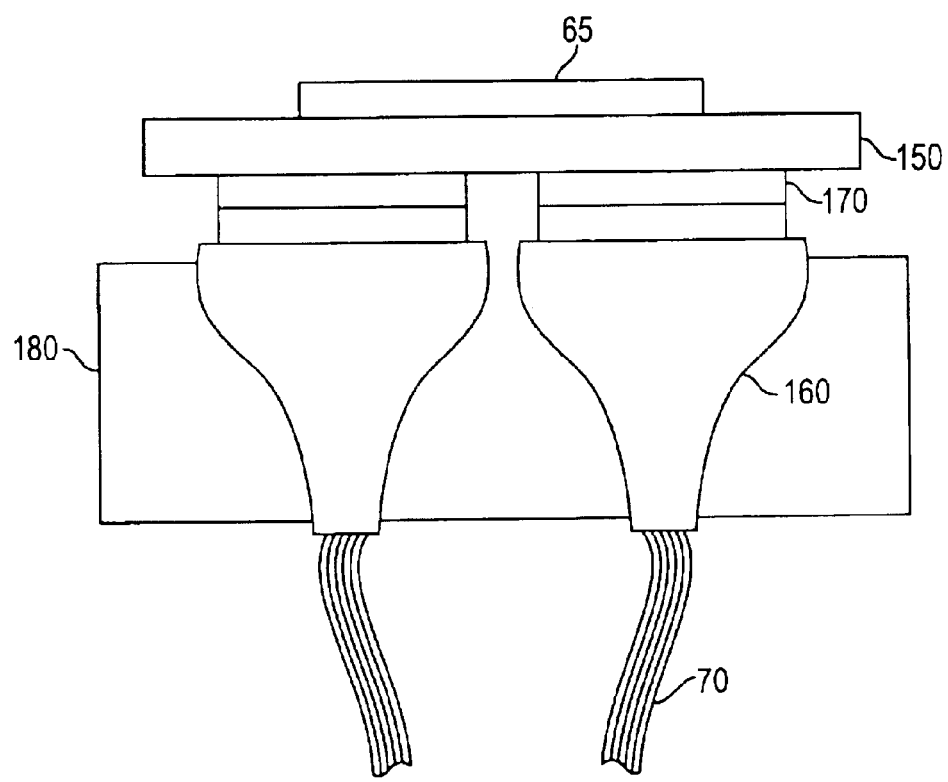
FIG. 4B is a side cross sectional view of a conventional plug-receptacle interface between a logic board and the cables.
Figure 4C:
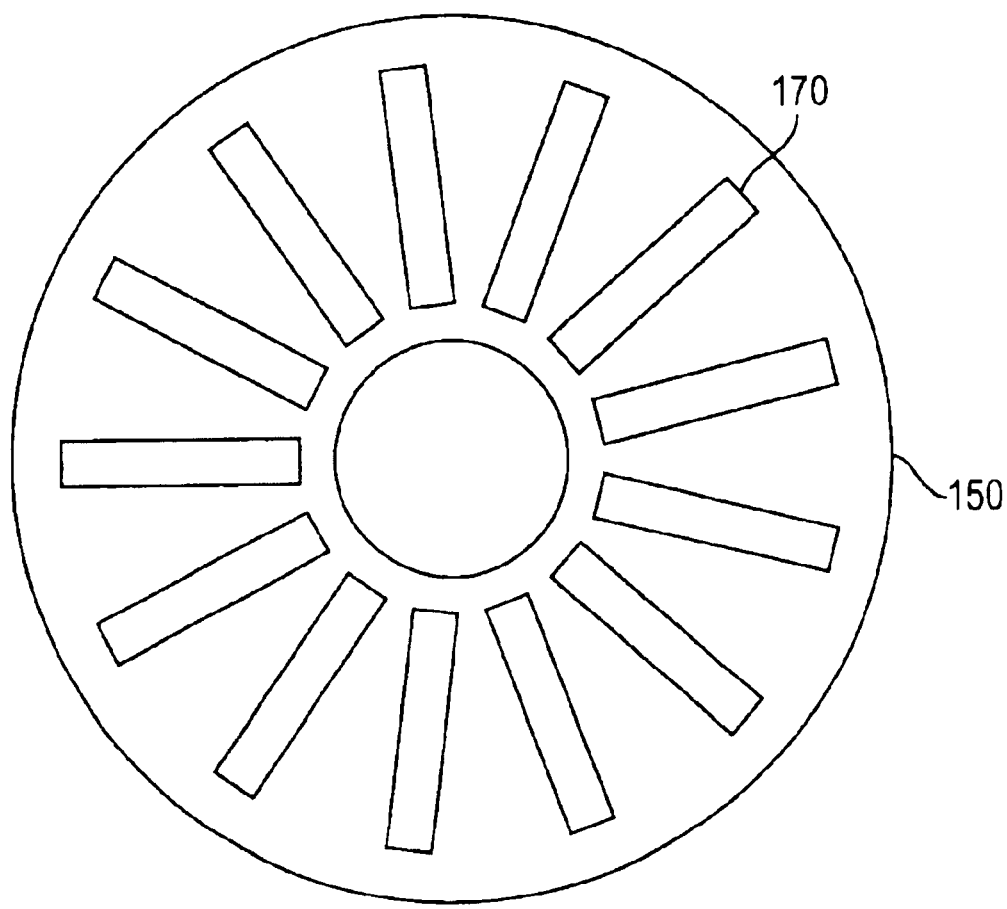
FIG. 4C is a bottom view of a conventional logic board showing the receptacles arrayed radially.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

For an embodiment of the present invention shown in FIGS. 5A through 6B, an array of shielded controlled impedance (SCI) connectors 220 are disposed in connector openings 249 in a board spacer 230. Each SCI connector 220 is connected to a cable 70, which extends through cable openings 247 in the board spacer 230. The relative size of the cable openings 247 and connector openings 249 forming array holes 245 restrains the movement of the SCI connector 220 in the X, Y and Z directions, and prevents the SCI connectors 220 from being pulled through into the interface. The array holes 245 are arranged as part of a larger array 240 on the board spacer 230.

Figure 5A:
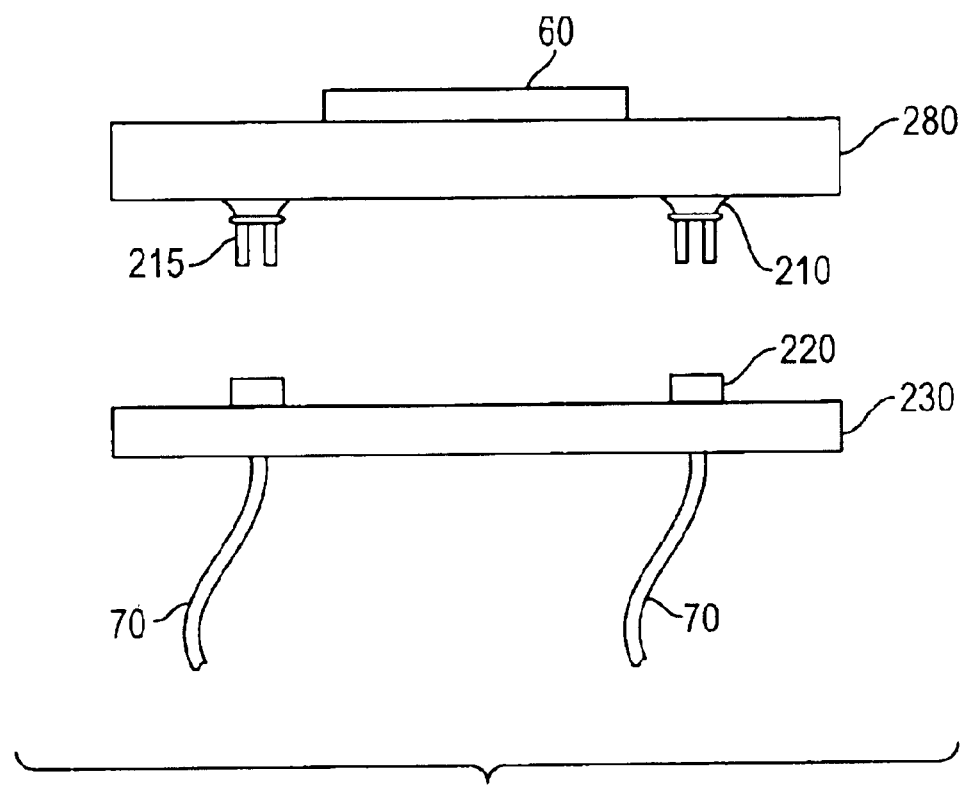
FIG. 5A is a front cross sectional view of an interface according to an embodiment of the present invention using shielded controlled impedance (SCI) connectors.
Figure 5B:
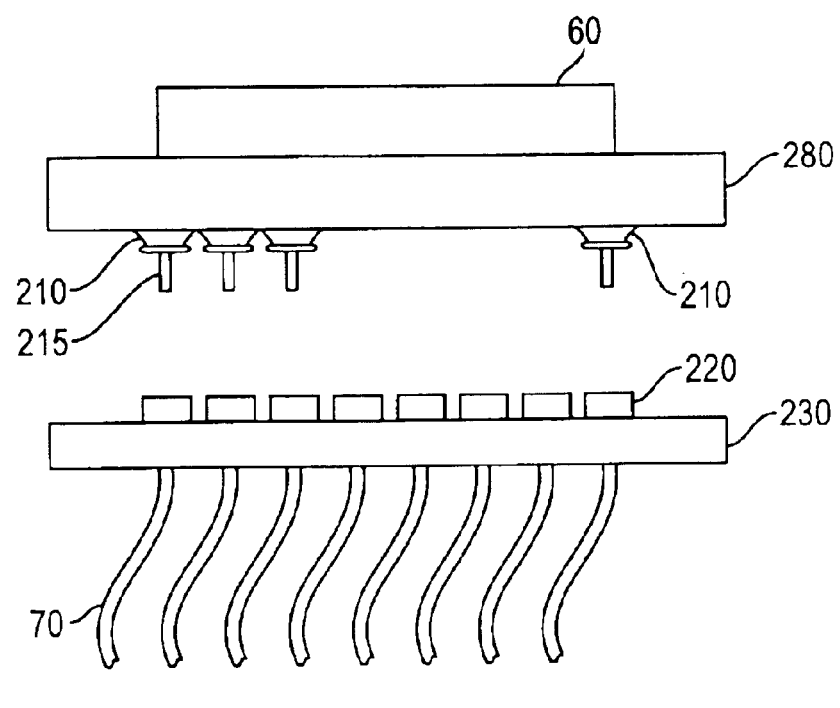
FIG. 5B is a side cross sectional view of an interface according to an embodiment of the present invention using SCI connectors showing that not all SCI connectors are used.
Figure 6A:
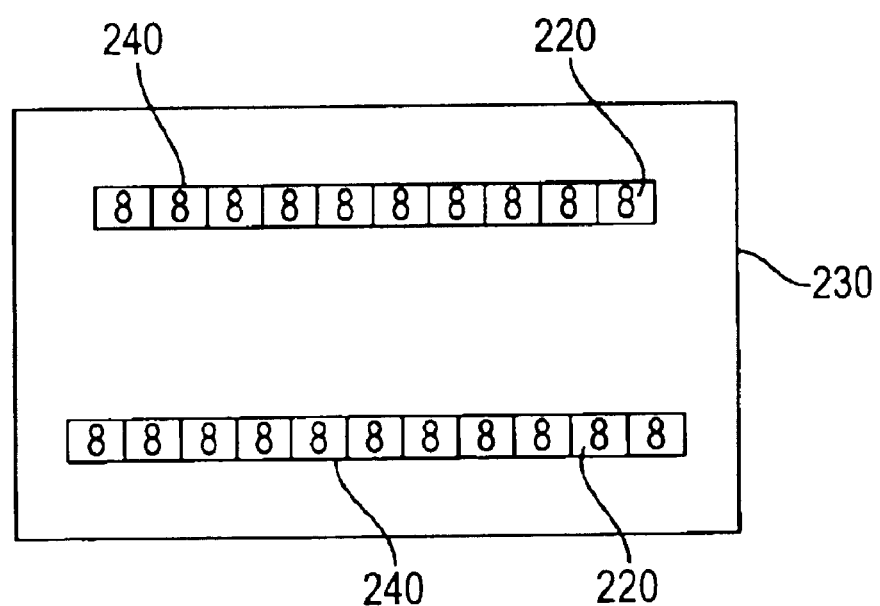
FIG. 6A is a top view of an array of SCI connectors on a board spacer according to an embodiment of the present invention.
Figure 6B:
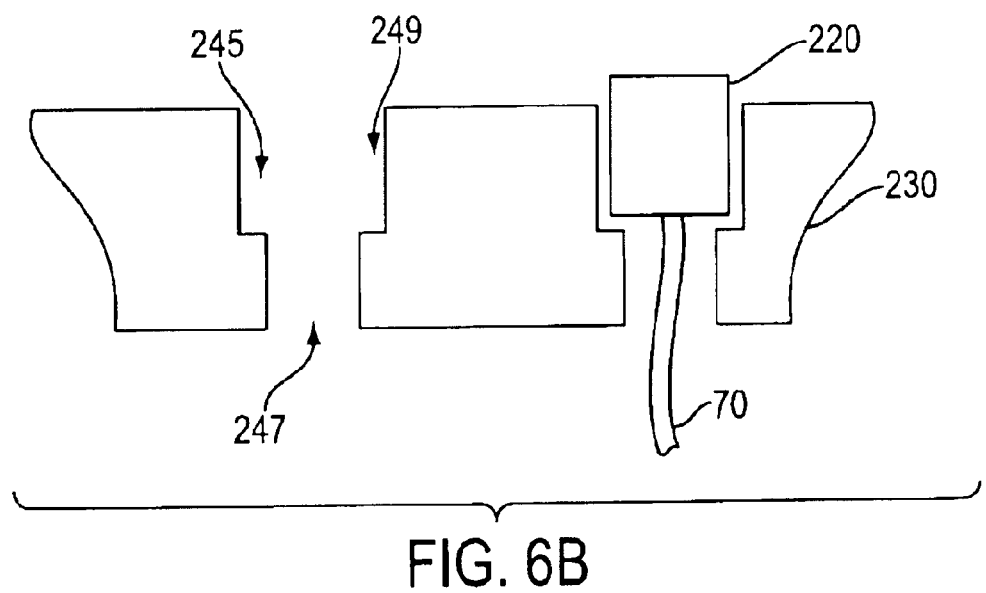
FIG. 6B is a side cross sectional view of the board spacer showing a SCI connector located in an array hole according to an embodiment of the present invention.

In order to form a communication pathway between SCI connectors 220 and respective DUTs 60, sets of headers 210 are arrayed on DUT board 280. Each header 210 contains header connectors 215, which are pairs of pins, each pair having a signal pin and a ground pin. A connector 220 from a respective cable 70 connects to one header connector 215. As shown in FIGS. 5A and 5B, the headers 210 are surface mounted to the DUT board 280, and are connected to the respective DUT 60 or DUTs 60 on the DUT board 280, depending on the configuration. These headers 210 and SCI connectors 220, when connected, form the communication pathways between the cables 70 and the respective DUTs 60.

Generally, the board spacer 230 has fully populated arrays 240, meaning that each array hole 245 in the array 240 has a respective SCI connector 220. In contrast, as shown in FIG. 5B, the DUT boards 280 do not always require the use of all of the SCI connectors 220, and only connect with selected ones of the connectors 220 depending on the type of DUT 60 to be tested. As such, for each SCI connector 220, there may or may not be a corresponding header connector 215. However, for each header connector 215, there is a corresponding SCI connector 220. In this way, the board spacer 230 forms a modular connector to multiple DUT boards 280. For each new type of DUT 60 to be tested, only the DUT board 280 needs to be changed such that the headers 210 for that DUT board 280 will connect to selected SCI connectors 220.

As shown, the SCI connector 220 is a 2 mm connector having a signal and a ground line. Such 2 mm connectors 220 can be WL Gore 2 mm EYEOPENER cable connectors, or SCI connectors from 3M, which are 1×2 2 mm controlled impedance connectors. Similarly, the header 210 is a surface mount technology 2 mm header, which allows 60–70 header connectors 215 to be used on each DUT board 280.

Of course, it is understood that it is also possible to use connectors 220 having other distances between signal and ground lines for the same connector 220, and/or between signal lines and ground lines of adjacent connectors 220 (i.e., other pitches). For instance, it is possible to use connectors 220 which have a 1.27 mm pitch or a 0.1" pitch.

Further, while the shown header 210 is surface mounted to the DUT board 280, it is understood that the through hole connection can be used. It is further understood, but not shown, that the headers 210 and SCI connectors 220 could be reversed such that the header 210 is located in the array 240 and the SCI connector 220 is surface mounted to the DUT board 280. However configured, the interface according to the preferred embodiments of the present invention is able to support high speed and high fidelity signals at frequencies above 50 MHz.

Figure 7:
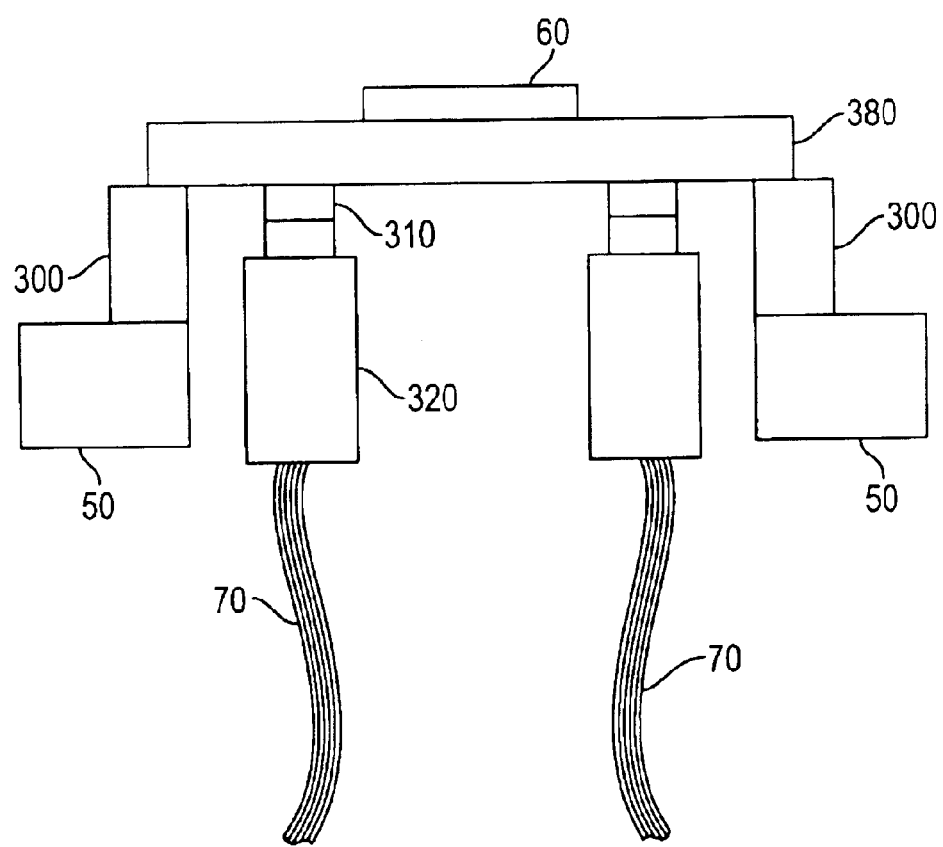
FIG. 7 is a schematic view showing an interface according to another embodiment of the present invention using a plug and receptacle to connect cables a DUT board.
Figure 8:
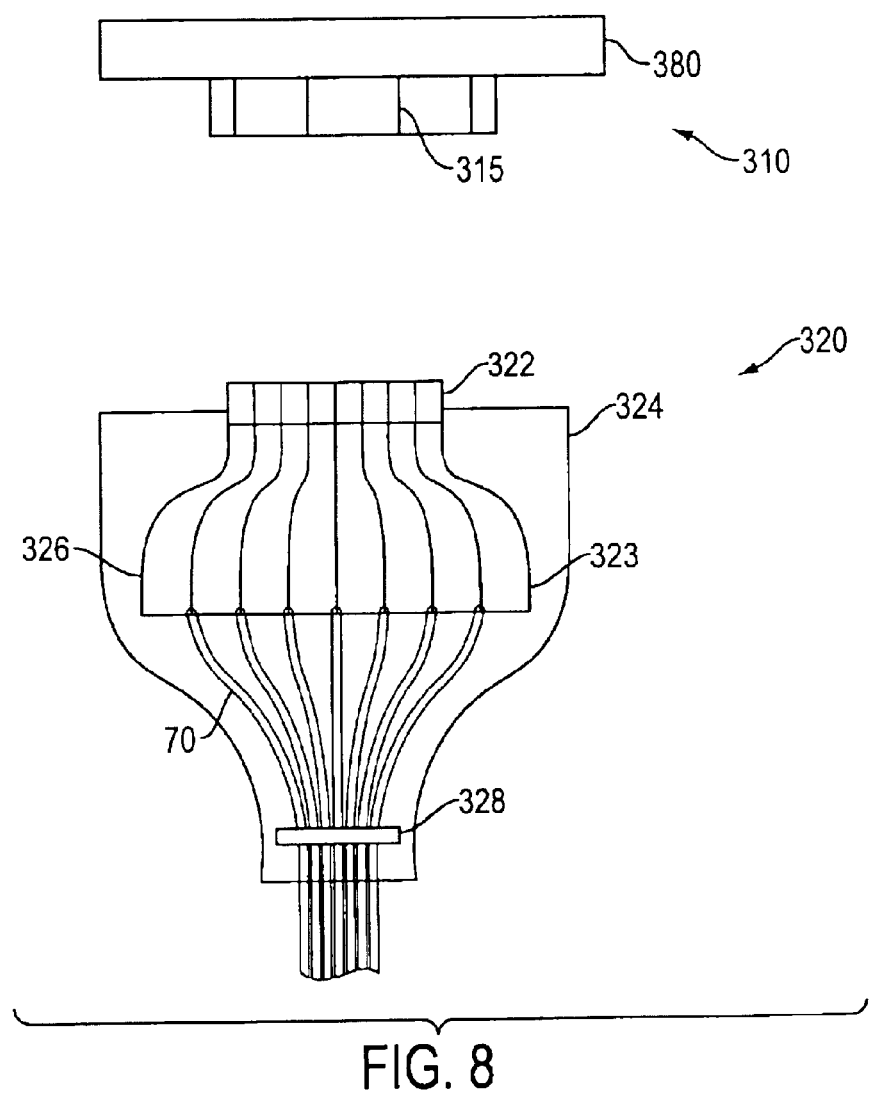
FIG. 8 is a cross sectional view of a plug showing the cables connecting to PCB according to another embodiment of the present invention.

Another embodiment of the present invention is shown in FIGS. 7 and 8. As shown in FIG. 7, cables 70 are connected to plug 320, which is plugged into receptacle 310. Receptacle 310 is mounted to DUT board 380, which holds the respective DUT 60 or DUTs 60, depending on the configuration. The DUT board 380 is supported by the spacing frame 50 via board spacer 300.

Generally, the plug 320 is attached to the receptacle 310 using screws, pull pins, a series of cams, or similar attachment mechanisms. However, it is also possible, but not shown, to construct a board spacer to support and hold the plugs 320 in an array.

As shown in FIG. 8, the plug 320 comprises a plug 322, which is straddle-mount connected to a printed circuit board (PCB) 323. The plug 322 and receptacle 310 pair can be a commercial pair, such as the Micropax plug/receptacle supplied by FCI.

The PCB 323 includes internal wires 326 that form communication pathways to respective cables 70. The cables 70 are connected to the respective wires 326 by conventional methods such as soldering. The cables 70 are supported using strain relief member 328, which is attached to housing 324 that also protects the assembly.

The receptacle 310 also has internal connection points (not shown), where the internal connection points are connected to receptacle wires 315 leading to the DUT 60. The internal connection points and associated wires 315 may be equal to or less than the number of wires 326/cables 70 for a respective plug 320, depending on how many of the cables 70 are required to test a specific type of DUT 60. In this way, the same plugs 320 can be used for various DUT boards 380 holding various types of DUTs 60, with the difference in connections being provided by selectively connecting to the wires 326 in the respective plugs 320.

Further, using this configuration, the number of plugs 320 can be reduced such that one or two plugs 320 are used per DUT board 380. Such a result is especially desirable where the DUT 60 is a memory device, and where space limitations have heretofore prevented the use of plug-receptacle connections. For instance, such an interface would be useful with a M65XX and M67XX Advantest handler which are capable of delivering thirty-two (32) devices per space frame (sixty-four (64) devices AD style), but which has pitch limitations preventing the use of conventional plug configurations.

Figure 9:
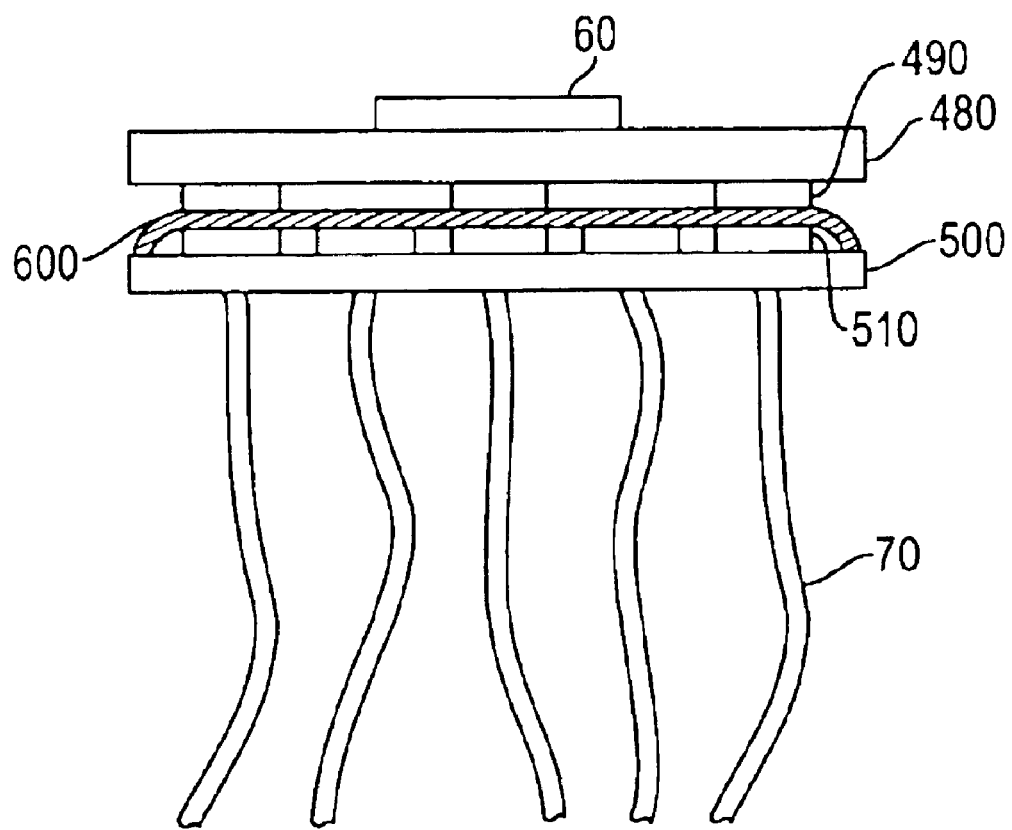
FIG. 9 is a schematic view showing an interface according to yet another embodiment of the present invention using an elastomer to form a conductive pathway between respective pads.

For still another embodiment of the present invention as shown in FIG. 9, a board spacer 500 includes an array of pads 510. Each pad 510 is connected to a respective cable 70. Board spacer 480, which holds DUTs 60, has a corresponding array of pads 490. The number of pads 490 are less than or equal to the number of pads 510 on the board spacer 500. The DUT board 480 is connected to the board spacer 500 using an elastomer 600, which allows the signal to pass from the pad 510 to the pad 490 and to a respective DUT 60. The elastomer 600 may be one supplied by Shin-Etsu or Fujipoly. It is understood, that the elastomer 60 does not need to be used in all applications.

By way of example, in order to test a different type of DUT 60 using the interface according to the embodiment of the present invention shown in FIG. 5A, the DUT board 280 for the first type of DUT 60 is unplugged from the board spacer 230, and the DUT board 280 for a new type of DUT 60 is plugged into the board spacer 230. The DUT board 280 for the new type of DUT 60 might have a different arrangement as to the number of pairs of prongs 215 within individual headers 210 as shown in FIG. 5A, or could be arranged otherwise as to not be fully populated with as many prongs 215 as there are connectors 220

As such, according to the preferred embodiments of the present invention, a common board spacer or connection scheme can be used which allows DUT boards housing different types of DUTs to be interchanged in a tester without having to rewire and reconnect cables to respective DUTs on the DUT board. Instead, they allow the use of predetermined connection points arrayed on a board spacer or in a plug to form the connection to the cables.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An interface between a device under test (DUT) and cables, comprising:

a first board having an array of first connectors, each first connector connected to a respective cable;

a second board holding the DUT and having second connectors, each second connector being connected to the DUT and to a respective first connector; and an elastomer disposed between the first and second connectors, wherein:

the first and second connectors comprise pads, and the pads are brought together to form a communication pathway for signals from the cables to the DUT.

2. The interface of claim 1, wherein each connection formed between the first and second connectors forms a communication pathway for signals having a frequency of at least 50 MHz.

3. The interface of claim 2, wherein the second connectors are disposed in rows in an array on said second board.

4. The interface of claim 1, wherein the elastomer comprises a conductive elastomeric connector.

5. The interface of claim 1, wherein the elastomer includes conductive elements to provide the communication pathways between corresponding pairs of the first and second connectors through the elastomer.

6. The interface of claim 1, wherein the number of second connectors is less than the number of first connectors.

7. A method of connecting a device under test (DUT) on a DUT board to cables for testing, comprising:

removing a first DUT board, which has first pads connected to a first DUT, from a board spacer, which has board pads connected to the cables, where pairs of respective first pads and board pads formed a board-to-board connection creating first communication pathways for signals between the cables and the first DUT; and placing a second DUT board, which has second pads connected to a second DUT, onto the board spacer such that pairs of respective second pads and board pads to form a board-to-board connection creating second communication pathways for signals between the cables and the second DUT.

8. The method of claim 7, wherein a number of first and second pads are different.

9. The method of claim 7, wherein an elastomer is disposed between the second pads and the board pads.

10. The method of claim 9, wherein each connection formed between pairs of respective second pads and boards pads create second communication pathway for signals having a frequency of at least 50 MHz.

11. The method of 10, wherein the board pads are disposed in rows in an array in the second board.

12. The method of claim 9, wherein the elastomer comprises a conductive elastomeric connector.

13. The method of claim 9, wherein the elastomer includes conductive elements to provide the second communication pathways between the second pads and the board pads.

* * * * *

UNITED STATES PATENT AND TRADEMARK OFFICE
CERTIFICATE OF CORRECTION

PATENT NO.        : 6,822,436 B2                                        Page 1 of 1
APPLICATION NO.   : 10/326392
DATED             : November 23, 2004
INVENTOR(S)       : James Warren Frame It is certified that error appears in the above-identified patent and that said Letters Patent is hereby corrected as shown below:

Title Page, item (56) References Cited, insert the following references:
-- 5,945,838 8/1999 Gallagher et al. --
-- 5,523,695 6/1996 Lin --
-- 5,896,037 4/1999 Kudla et al. --
-- WO 02/056044 7/18/2002 WIPO --
-- WO 99/38197 7/29/1999 WIPO --
-- JP 04-025777 3/31/1998 Japan --

Signed and Sealed this

Nineteenth Day of December, 2006

JON W. DUDAS
*Director of the United States Patent and Trademark Office*